(12) United States Patent
Saly et al.

(10) Patent No.: US 10,985,014 B2
(45) Date of Patent: Apr. 20, 2021

(54) METHODS FOR SELECTIVE DEPOSITION ON SILICON-BASED DIELECTRICS

(71) Applicant: Applied Materials, Inc., Santa Clara, CA (US)

(72) Inventors: Mark Saly, Santa Clara, CA (US); Bhaskar Jyoti Bhuyan, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/632,014

(22) PCT Filed: Jul. 17, 2018

(86) PCT No.: PCT/US2018/042472
§ 371 (c)(1),
(2) Date: Jan. 17, 2020

(87) PCT Pub. No.: WO2019/023001
PCT Pub. Date: Jan. 31, 2019

(65) Prior Publication Data
US 2020/0234950 A1 Jul. 23, 2020

Related U.S. Application Data

(60) Provisional application No. 62/535,956, filed on Jul. 23, 2017.

(51) Int. Cl.
*H01L 21/02* (2006.01)
*H01L 21/768* (2006.01)

(52) U.S. Cl.
CPC .... *H01L 21/02266* (2013.01); *H01L 21/0228* (2013.01); *H01L 21/02274* (2013.01); *H01L 21/76826* (2013.01)

(58) Field of Classification Search
CPC ......... H01L 21/02266; H01L 21/02274; H01L 21/0228; H01L 21/76826; H01L 21/32; H01L 21/306; H01L 21/02271
See application file for complete search history.

(56) References Cited

U.S. PATENT DOCUMENTS

| | | | |
|---|---|---|---|
| 2002/0139975 A1* | 10/2002 | Lewis | H01L 21/02118 257/40 |
| 2011/0198736 A1* | 8/2011 | Shero | C23C 16/45525 257/629 |
| 2016/0222504 A1 | 8/2016 | Haukka et al. | |

FOREIGN PATENT DOCUMENTS

| | | |
|---|---|---|
| JP | 2013520028 A | 5/2013 |
| KR | 20170046733 A | 5/2017 |

(Continued)

OTHER PUBLICATIONS

PCT International Search Report and Written Opinion in PCT/US2018/042472 dated Nov. 2, 2018, 9 pages.

(Continued)

*Primary Examiner* — Julia Slutsker
(74) *Attorney, Agent, or Firm* — Servilla Whitney LLC

(57) ABSTRACT

Methods of selectively depositing a film on a hydroxide terminated surface relative to a hydrogen terminated surface are described. The hydrogen terminated surface is exposed to a nitriding agent to form an amine terminated surface which is exposed to a blocking molecule to form a blocking layer on the surface. A film can then be selectively deposited on the hydroxide terminated surface.

20 Claims, 2 Drawing Sheets

(56) References Cited

FOREIGN PATENT DOCUMENTS

WO     2016130238 A1    8/2016
WO     2017/048911 A1    3/2017

OTHER PUBLICATIONS

Tian, Fangyuan, et al., "Silicon Surface Functionalization Targeting Si—N Linkages", Langmuir 2013, 29, pp. 13-28.

* cited by examiner

METHODS FOR SELECTIVE DEPOSITION ON SILICON-BASED DIELECTRICS

CROSS-REFERENCE TO RELATED APPLICATIONS

This application is the National Stage entry of PCT/US18/42472, filed on Jul. 17, 2018, which claims priority to United States Provisional Application. Ser. No. 62/535,956, filed Jul. 23, 2017, the entire disclosures of which are hereby incorporated herein in their entireties.

FIELD

Embodiments of the disclosure relate to methods for selectively depositing films. More particularly, embodiments of the disclosure are directed to methods selectively depositing films on silicon-based dielectrics and not on hydrogen terminated silicon surfaces.

BACKGROUND

The semiconductor industry faces many challenges in the pursuit of device miniaturization which involves rapid scaling of nanoscale features. Such issues include the introduction of complex device fabrication processes with multiple lithography steps and etch. Furthermore, the semiconductor industry would like low cost alternatives to high cost EUV for patterning complex architectures. To maintain the cadence of device miniaturization and keep chip manufacturing costs down, selective deposition has shown promise as it has the potential to remove costly lithographic steps by simplifying integration schemes.

Selective deposition of materials can be accomplished in a variety of ways. For instance, some process may have inherent selectivity to surfaces just based on their surface chemistry. These processes are fairly rare and usually need to have surfaces with drastically different surface energies, such as metals and dielectrics. In the cases where surfaces are similar ($SiO_2$ versus Si—H terminated or SiN) the surfaces need to be selectively blocked by employing surface treatments that selectively react with one surface and not the other, effectively blocking any surface reactions during the ALD or CVD process.

One of the most challenging selective growth processes to enable is growth on dielectrics (low K, SiO, SiON, etc.) with no growth on Si (hydrogen terminated). The challenge stems from the inability to successfully react blocking molecules with a relatively strong silicon hydrogen bond. Enabling process flows to successfully block Si (H terminated) and not block the other dielectric surfaces has the potential to open up many integration schemes (selective caps, selective diffusion barriers, selective etch stops, self-alignment) to device manufacturers and therefore greatly advance progress in the field.

Therefore, there is an ongoing need in the art for methods to selectively deposit films on dielectric surfaces.

SUMMARY

One or more embodiments of the disclosure are directed to methods comprising exposing a substrate having a first surface with hydrogen terminations and a second surface with hydroxide terminations to a nitriding agent to form an amine terminated first surface. The amine terminated first surface is exposed to a blocking molecule to form a blocking layer on the first surface.

Additional embodiments of the disclosure are directed to methods comprising providing a substrate comprising a first material having a first surface with hydrogen terminations and a second material having a second surface with hydroxyl terminations. The substrate is exposed to a nitriding agent comprising a species that reacts with the hydrogen terminations of the first surface to form an amine terminated first surface. The amine terminated first surface is exposed to a blocking molecule to form a blocking layer on the first surface.

Further embodiments of the disclosure are directed to methods of depositing a film. A substrate comprising a first material comprising silicon having a first surface with hydrogen terminations and a second material comprising silicon oxide having a second surface with hydroxyl terminations is provided. The substrate is exposed to a nitriding agent comprising ammonia that reacts with the hydrogen terminations of the first surface to form an amine terminated first surface. The amine terminated first surface is exposed to a blocking molecule comprising undecanal to form a blocking layer on the first surface. A film is selectively deposited on the second surface.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of the disclosure and are therefore not to be considered limiting of its scope, for the disclosure may admit to other equally effective embodiments.

DETAILED DESCRIPTION

Figure 1:
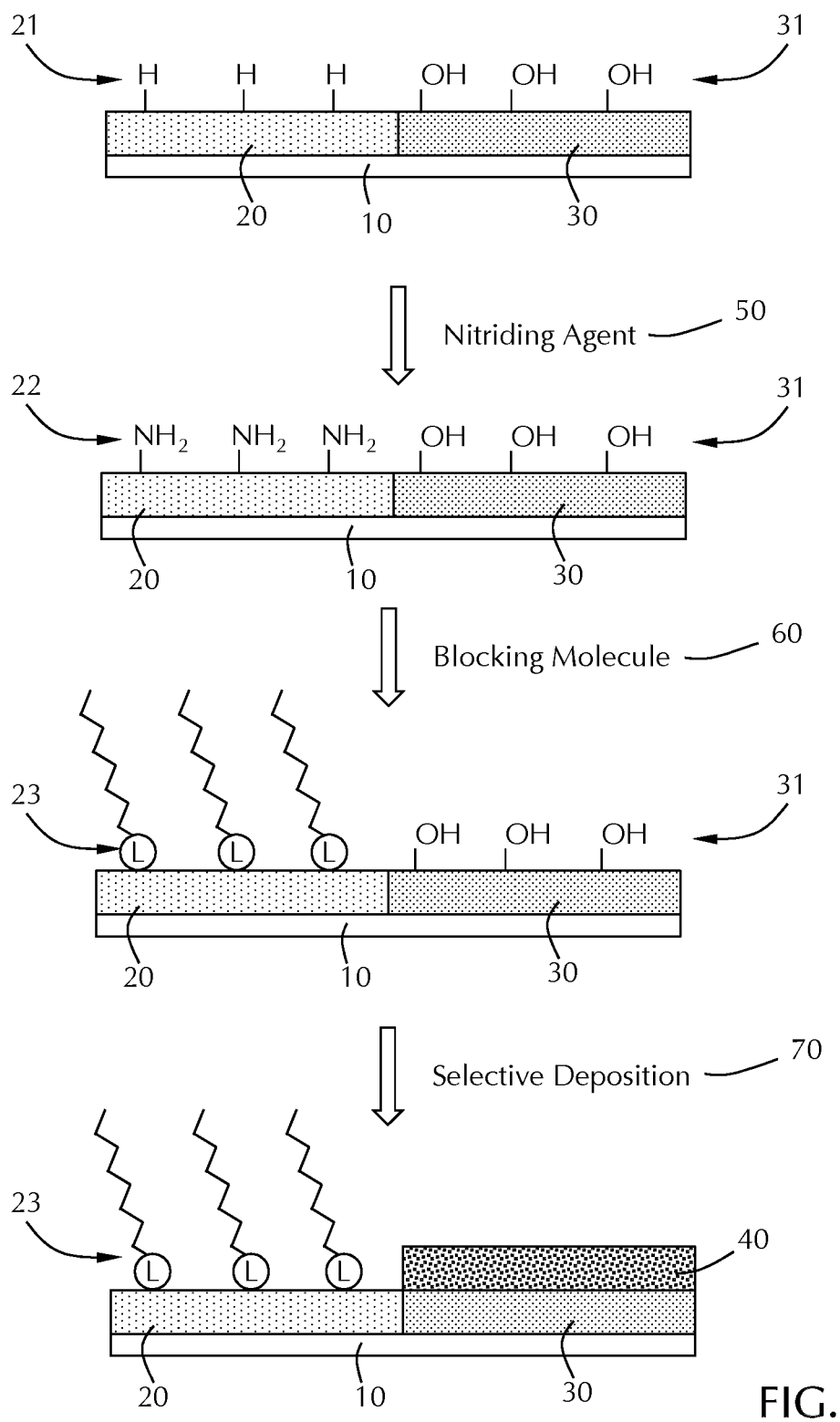
FIG. 1 illustrates a selective deposition process in accordance with one or more embodiment of the disclosure.

Embodiments of the disclosure provide methods for selectively depositing molecular layers comprised of organic or hybrid organic/inorganic layers. The process of various embodiments uses molecular layer deposition techniques similar to atomic layer deposition (ALD) to provide molecular layers on a substrate.

A "substrate surface", as used herein, refers to any portion of a substrate or portion of a material surface formed on a substrate upon which film processing is performed. For example, a substrate surface on which processing can be performed include materials such as silicon, silicon oxide, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. Substrates may have various dimensions, such as 200 mm or 300 mm diameter wafers, as well as, rectangular or square panes. In some embodiments, the substrate comprises a rigid discrete material.

"Atomic layer deposition" or "Molecular layer deposition" as used herein refers to the sequential exposure to a substrate of two or more deposition gases to deposit a layer of material on a substrate surface. As used in this specification and the appended claims, the terms "reactive compound", "reactive gas", "reactive species", "precursor", "process gas", :deposition gas" and the like are used interchangeably to mean a substance with a species capable of reacting with the substrate surface or material on the substrate surface in a chemical reaction (e.g., substitution, elimination, addition, oxidation, reduction). The substrate, or portion of the substrate, is exposed sequentially to the two or more reactive compounds which are introduced into a reaction zone of a processing chamber. In a time-domain process, exposure to each reactive compound is separated by a time delay to allow each compound to react with the substrate surface and then be purged from the processing chamber. In a spatial process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired molecular layer or layer thickness is formed on the substrate surface. In either scenario, the process of pulsing compound A, purge gas, compound B and purge gas is a cycle. A cycle can start with either compound A or compound B and continue the respective order of the cycle until achieving a film with the predetermined thickness.

In an embodiment of a spatial process, a first reactive gas and second reactive gas are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas, although not simultaneously.

One or more embodiments of the disclosure advantageously provide methods of selectively depositing a variety of films on a dielectric (such as $SiO_2$, SiON, and low K) with substantially no deposition on silicon surfaces that are hydrogen terminated. In some embodiments, the selective deposition is advantageously accomplished by combining a selective surface nitridation step coupled with a blocking molecule that selectively reacts with Si—$NH_2$ bonds to form a passivated surface on the hydrogen terminated silicon surface.

A general surface mechanism of one or more embodiment of the disclosure can be carried out to block Si—H surfaces and subsequently stop or minimize deposition. In some embodiments, a hydrogen terminated Si surface is selectively nitridated via $NH_3$ thermal annealing or $NH_3$ plasma treatment. Hydrogen terminated Si surfaces can be annealed under $NH_3$ at temperatures >350° C. to decrease the concentration of Si—H and increase the concentration of Si—$NH_2$ species. Without being bound by any particular theory of operation, it is believed that $NH_3$ thermal annealing of silicon based dielectrics ($SiO_2$, SiOC, SiON, etc.) will not lead to the formation of Si—$NH_2$ surface groups because breaking Si—O bonds to form Si—$NH_2$ bonds is not thermodynamically favorable.

Once the selective nitridation is complete, the Si—NH2 groups can be reacted with blocking molecules that have reactivity with Si—$NH_2$ and not Si—OH. Molecules that fit in this category include, but are not limited to, ketones, aldehydes, acyl chlorides, anhydrides, and alcohols. These molecules can be introduced to the substrates via vapor phase delivery, in solution form or in neat form. Undecanal has been observed to selectively react with Si—$NH_2$ groups via a Schiff base reaction mechanism to selectively passivate Si—$NH_2$ and not react with Si—OH. After selective surface passivation, ALD processes can be employed to grow films selectively on the silicon-based dielectric.

With reference to FIG. 1, one or more embodiments of the disclosure are directed to a method of depositing a film. The method comprises providing a substrate 10 comprising a first material 20 and a second material 30. As used in this manner, the term "providing a substrate" means that the substrate is placed into a position (e.g., within a processing chamber) for processing. The first material 20 has a first surface with hydrogen terminations 21. The second material 30 has a second surface with hydroxide terminations 31.

The first material 20 can be any suitable material including, but not limited to, silicon. In some embodiments, the first material 20 consists essentially of silicon and the first surface is an Si—H terminated surface. As used in this specification and the appended claims, a material that "consists essentially of" a stated composition means that greater than or equal to about 95%, 98% or 99% of the R groups of the surface area of the subject material is the stated composition.

The second material 30 can be any suitable material including, but not limited to, a silicon dielectric (e.g., silicon oxide). In some embodiments, the second material 30 consists essentially of silicon oxide.

The substrate 10, and the first material 20 and second material 30, is exposed to a nitriding agent 50. The nitriding agent 50 reacts with the hydrogen terminations 21 on the first surface of the first material 20 to form an amine terminated 22 first surface on the material 20. The amine terminated 22 surface can be any combination of —NH, —$NH_2$ or non-stoichiometric combination of nitrogen and hydrogen atoms. The amine terminated surface is able to be subjected to a Schiff base type reaction in a subsequent chemical exposure.

The nitriding agent 50 can be any suitable compound that can react with the hydrogen terminations 21. In some embodiments, the nitriding agent comprises one or more of ammonia, hydrazine, ammonia plasma or hydrazine plasma. In some embodiments, the nitriding agent 50 comprises thermal ammonia. As used in this manner, the term "thermal ammonia" means ammonia exposed to the substrate surface at a temperature greater than or equal to about 200° C. and without plasma. In some embodiments, the nitriding agent 50 consists essentially of ammonia. As used in this regard, the term "consists essentially of" means that the reactive component of the nitriding agent (not including inert, diluent or carrier species) is greater than or equal to about 95%, 98% or 99% of the stated species on a molar basis. In some embodiments, the nitriding agent consists essentially of thermal ammonia.

In some embodiments, the nitriding agent comprises a plasma. The plasma can be a conductively coupled plasma (CCP) or an inductively coupled plasma (ICP). The plasma can be a direct plasma or a remote plasma. In some embodiments, the plasma is a remote plasma. In some embodiments, the plasma is a soft radical plasma, meaning that there are plasma species comprises greater than or equal to about 2:1 ions:radicals of the plasma species.

The nitriding agent can be exposed to the substrate as a vapor phase component, as a solution or neat. In some embodiments, the nitriding agent is a vapor phase component delivered in a processing chamber (e.g., an atomic layer deposition chamber). The pressure in the processing chamber can be in the range of about 1 Torr to about 800 Torr. The temperature in the processing chamber can be in the range of about room temperature (25° C.) to about 700° C. In some embodiments, the nitriding agent is exposed to the substrate in a solution or neat, in a wet chemistry process.

After nitriding, the amine terminated 22 surface can be exposed to a blocking molecule 60. The blocking molecule can be any suitable compound that can react with the amine terminated 22 surface and not the hydroxide terminated 31 surface. The blocking molecule 60 reacts with the amine terminated 22 surface to form a blocking layer 23 on the first material 20.

The blocking molecule 60 of some embodiments comprises one or more of a carboxylic acid, acyl halide, ketone, anhydride, alcohol or aldehyde. In some embodiments, the blocking molecule 60 comprises an aldehyde. In some embodiments, the blocking molecule 60 consists essentially of an aldehyde. As used in this manner, the term "consists essentially of" means that the reactive component of the blocking molecule (not including inert, diluent or carrier species) is greater than or equal to about 95%, 98% or 99% of the stated species, on a molar basis. In some embodiments, the blocking molecule 60 comprises an carboxylic acid. In some embodiments, the blocking molecule 60 consists essentially of an carboxylic acid. In some embodiments, the blocking molecule 60 comprises an acyl halide. In some embodiments, the blocking molecule 60 consists essentially of an acyl halide. In some embodiments, the blocking molecule 60 comprises an ketone. In some embodiments, the blocking molecule 60 consists essentially of an ketone. In some embodiments, the blocking molecule 60 comprises an anhydride. In some embodiments, the blocking molecule 60 consists essentially of an anhydride. In some embodiments, the blocking molecule 60 comprises an alcohol. In some embodiments, the blocking molecule 60 consists essentially of an alcohol.

The blocking molecule and blocking layer 23 shown in FIG. 1 has a head group designated L and a tail. The tail of some embodiments is a chain of branched or unbranched carbon atoms that may be substituted or unsubstituted. The L group represents any ligand or chemical species that can react with the amine terminated 22 surface. In some embodiments, the blocking molecule comprises a species having in the range of about 1 to about 20 carbon atoms. In some embodiments, the blocking molecule comprises a species having greater than or equal to about 2, 3, 4, 5, 6, 7, 8, 9, 10, 11, 12, 13, 14, 15 or 16 carbon atoms and less than or equal to about 20 carbon atoms. In some embodiments, the blocking molecule has in the range of about 6 to about 20 carbon atoms. In certain embodiments, the blocking molecule comprises, or consists essentially of, undecanal.

After formation of the blocking layer 23, a selective deposition 70 of a film 40 on the second material 30 can be performed. The film 40 can be deposited by any suitable deposition technique known to the skilled artisan. Suitable techniques include, but are not limited to, chemical vapor deposition, atomic layer deposition or physical vapor deposition.

After formation of the film 40, the blocking layer 23 can be left on the first material 20 or removed. Since the blocking layer 23 is basically one monolayer of material, it may not interfere with further processing, depending on the process conditions and subsequent films being deposited. In some embodiments, the blocking layer 23 is removed prior to further processing. The blocking layer 23 can be removed by any suitable technique that can remove the blocking layer 23 without substantially damaging the film 40 deposited on the second material 30. Suitable techniques include, but are not limited to, oxidation or etching. Oxidation can be by exposure to an oxidizer (e.g., oxygen plasma, ozone, high temperature oxygen anneal, peroxide or water).

EXAMPLE

Selective Blocking of Hydrogen Terminated Silicon Using Undecanal as the Blocking Molecule.

Multiple hydrogen-terminated silicon substrates (dipped in dilute HF for 1 minute) and $SiO_2$ substrates were loaded into a deposition chamber and treated with $NH_3$ gas at pressures of 20-30 Torr at 330° C. for about 15 minutes. After the $NH_3$ anneal, the substrates were moved to the load lock and cooled for about 30 minutes (~23° C.). The substrates were immediately placed in a glove box where they were treated in one of the following manners: (1) soaked in a 20 mM solution of undecanal in DMSO for 16 hours at 65° C., removed from the solution and cooled to room temperature and then rinsed with IPA, followed by drying with $N_2$; or (2) soaked in DMSO for 16 hours at 65° C., removed from the solution and cooled to room temperature and then rinsed with IPA, followed by drying with $N_2$.

Figure 2:
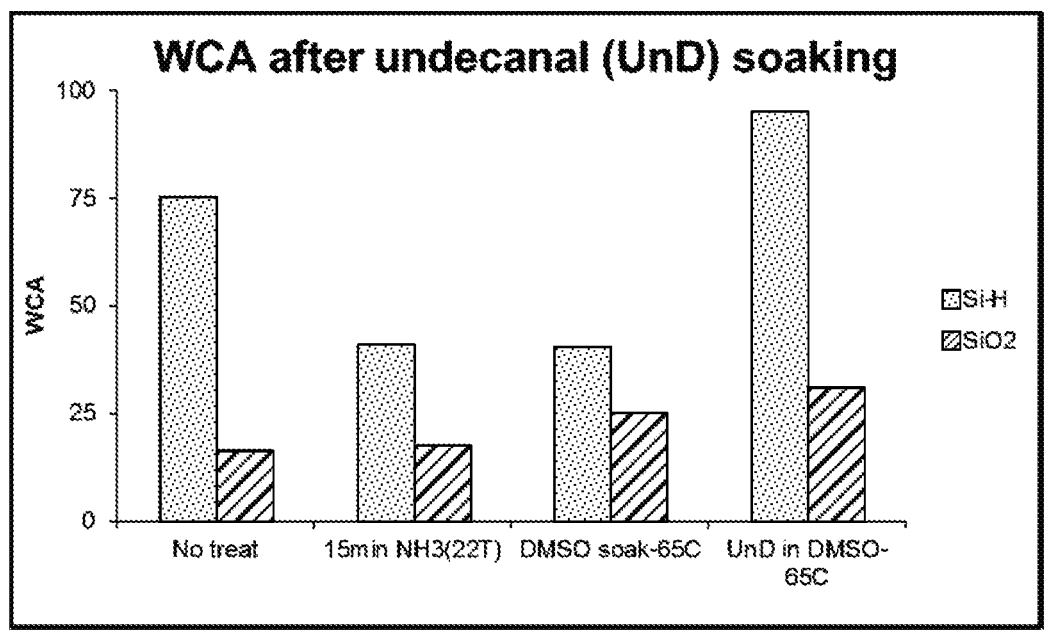
FIG. 2 is a graph of the water contact angle for samples prepared in accordance with one or more embodiment of the disclosure.

The water contact angle of the surfaces was measured after drying. In addition to measuring the surface water contact angle of the substrates prepared above, a contact angle of substrates before placing in the annealing chamber and post annealing was also recorded. FIG. 2 shows the water contact angles for substrates 1) before annealing (no treat) 2) after annealing 3) after soaking in DMSO and 4) After soaking in an undecanol/DMSO solution. The bar graph shows that after nitridation and undecanol treatment there was a notable difference in the water contact angle (WCA) between hydrogen terminated silicon surfaces (~95°) and silicon dioxide surfaces (~31°) which indicated that the hydrogen terminated surface was hydrophobic caused by the undecanal carbon chains passivated on the surface.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method comprising:
    exposing a substrate having a first surface with hydrogen terminations and a second surface with hydroxide terminations to a nitriding agent to form an amine terminated first surface; and
    exposing the amine terminated first surface to a blocking molecule to form a blocking layer on the first surface.

2. The method of claim 1, wherein the first surface comprises silicon and the second surface comprises a silicon dielectric.

3. The method of claim 1, wherein the nitriding agent comprises one or more of ammonia, hydrazine or plasmas thereof.

4. The method of claim 1, wherein the blocking molecule comprises one or more of a carboxylic acid, acyl halide, ketone, anhydride, alcohol or aldehyde.

5. The method of claim 4, wherein the blocking molecule has in the range of about 1 to about 20 carbon atoms.

6. The method of claim 5, wherein the blocking molecule has in the range of about 6 to about 20 carbon atoms.

7. The method of claim 1, wherein the blocking molecule comprises undecanal.

8. The method of claim 1, further comprising selectively depositing a film on the second surface.

9. The method of claim 8, further comprising removing the blocking layer from the first surface after depositing a layer on the second surface.

10. The method of claim 9, wherein removing the blocking layer comprises exposing the blocking layer to an oxidizer.

11. The method of claim 10, wherein the oxidizer comprises one or more of oxygen plasma, ozone, high temperature oxygen anneal, peroxide or water.

12. The method of claim 8, wherein the blocking layer is not removed from the first surface after depositing a layer on the second surface.

13. A method of depositing a film comprising:
    providing a substrate comprising a first material having a first surface with hydrogen terminations and a second material having a second surface with hydroxyl terminations;
    exposing the substrate to a nitriding agent comprising a species that reacts with the hydrogen terminations of the first surface to form an amine terminated first surface; and
    exposing the amine terminated first surface to a blocking molecule to form a blocking layer on the first surface.

14. The method of claim 13, wherein the first surface comprises silicon and the second surface comprises a silicon dielectric.

15. The method of claim 13, wherein the nitriding agent comprises one or more of ammonia, hydrazine or plasmas thereof.

16. The method of claim 13, wherein the blocking molecule comprises one or more of a carboxylic acid, acyl halide, ketone, anhydride, alcohol or aldehyde.

17. The method of claim 16, wherein the blocking molecule has in the range of about 6 to about 20 carbon atoms.

18. The method of claim 13, wherein the blocking molecule comprises undecanal.

19. The method of claim 13, further comprising selectively depositing a film on the second surface.

20. A method of depositing a film comprising:
    providing a substrate comprising a first material comprising silicon having a first surface with hydrogen terminations and a second material comprising silicon oxide having a second surface with hydroxyl terminations;
    exposing the substrate to a nitriding agent comprising ammonia that reacts with the hydrogen terminations of the first surface to form an amine terminated first surface; and
    exposing the amine terminated first surface to a blocking molecule comprising undecanal to form a blocking layer on the first surface; and
    selectively depositing a film on the second surface.

* * * * *